United States Patent
Tanizawa

(10) Patent No.: US 7,231,312 B2
(45) Date of Patent: Jun. 12, 2007

(54) PHYSICAL QUANTITY DETECTING METHOD AND SENSOR DEVICE

(75) Inventor: Yukihiko Tanizawa, Kariya (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 11/358,055

(22) Filed: Feb. 22, 2006

(65) Prior Publication Data
US 2006/0224350 A1    Oct. 5, 2006

(30) Foreign Application Priority Data
Mar. 31, 2005   (JP)   ............................. 2005-105018

(51) Int. Cl.
*G01K 1/00*   (2006.01)
(52) U.S. Cl. ................................... 702/130
(58) Field of Classification Search ................ 702/130
See application file for complete search history.

(56) References Cited

U.S. PATENT DOCUMENTS 3,996,590 A * 12/1976 Hammack .................. 342/465
5,361,218 A * 11/1994 Tripp et al. .................. 702/88
6,307,496 B1   10/2001 Ikuta et al.

FOREIGN PATENT DOCUMENTS

JP     A-6-088847     3/1994

* cited by examiner

*Primary Examiner*—John Barlow
*Assistant Examiner*—Cindy D. Khuu
(74) *Attorney, Agent, or Firm*—Posz Law Group, PLC

(57) ABSTRACT

A physical quantity is detected by approximating a relationship between an output of a sensor and the physical quantity to be determined by the sensor by setting as coefficients of a quadratic equation a temperature characteristic of nonlinearity of the sensor to the physical quantity and temperature characteristics of parameters affecting the output of the sensor. Each of the coefficients is approximated by a higher-order equation with the temperature set as an independent variable, and the temperature coefficient is stored in advance. The temperature coefficient stored in the storage unit and the real-time temperature are substituted into the higher-order equation. The achieved coefficients and the output of the sensor are substituted into the quadratic equation to calculate the actual physical quantity.

9 Claims, 4 Drawing Sheets

$T_0 = -30°C$
$T_1 = 25°C$
$T_2 = 100°C$

AD CONVERSION VALUE $C_1 = A \cdot X^2 + B \cdot X + C_0$

ESTIMATED VALUE X

| PARAMETER | TEMPERATURE COEFFICIENT | | |
|---|---|---|---|
| | 0-ORDER | 1st-ORDER | 2nd-ORDER |
| OFFSET $C_0 = O_2 \cdot T^2 + O_1 \cdot T + O_0$ | $O_0$ | $O_1$ | $O_2$ |
| SENSITIVITY $B = S_2 \cdot T^2 + S_1 \cdot T + S_0$ | $S_0$ | $S_1$ | $S_2$ |
| NON-LINEARITY $A = N_2 \cdot T^2 + N_1 \cdot T + N_0$ | $N_0$ | $N_1$ | $N_2$ |

PHYSICAL QUANTITY DETECTING METHOD AND SENSOR DEVICE

CROSS REFERENCE TO RELATED APPLICATION

This application is based on and incorporates herein by reference Japanese patent application No. 2005-105018 filed on Mar. 31, 2005.

TECHNICAL FIELD

The technical field relates to a physical quantity detecting method for correcting the relationship between a physical quantity to be detected and a sensor output to detect the physical quantity, and a sensor device using the detecting method.

BACKGROUND

Recently, various types of controls containing the control of converting sensor signals output from various kinds of sensors for detecting physical quantities such as temperature, pressure, magnetic field, etc. to digital data and controlling the driving of an engine by using the digital data, etc. have been carried out in vehicles, for example. With respect to these sensors, they have normally parameters dependent on the temperature such as offset and sensitivity, and thus there occurs a disadvantage that the above sensor signals indicate different values in accordance with the temperature at that time although the detection target physical quantity is identical. When the difference between the actual physical quantity and the sensor signal is increased due to the characteristic of the sensor as described above, the reliability of the control itself described above is greatly lowered. Therefore, some correction has been hitherto carried out on the sensor signal in consideration of the temperature characteristic of the sensor as described above. A method using a sensor device described in JP-A-11-44585 (Patent Document 1) is known as an example of the correcting method.

That is, according to this sensor device, the relationship between the variation of the actual physical quantity and the sensor signal is approximately linearly, that is, by a linear expression in consideration of the offset and the sensitivity to determine a correcting coefficient for correcting the signal output from the sensor to a value which considers the temperature of the sensor at that time. The correcting coefficient thus determined is suitably stored, and when a physical quantity is detected, the temperature of the sensor is determined, and the physical quantity detected on a case-by-case basis (the real-time detected physical quantity) is corrected by using the temperature-correcting coefficient considering the sensor temperature thus determined.

With respect to some sensor devices, the parameters such as the offset, the sensitivity, etc. vary non-linearly dependently on the temperature in many cases. In this case, the variation of the sensor signal with respect to the actual variation of the physical quantity is more complicated due to the non-linear temperature characteristics of these parameters. In addition, in the conventional sensor device described above, the relationship between the physical quantity to be detected and the sensor signal is linearly approximated in consideration of the offset, the sensitivity, etc. Therefore, when the sensor device is applied to a sensor in which the above-described parameters themselves have non-linear temperature characteristics such as an infrared sensor using a thermopile, a magnetic sensor using a magneto-resistance sensor, a current sensor or the like, the detection precision is unavoidably lowered.

SUMMARY

In view of the foregoing situation, it is an object to provide a physical quantity detecting method with which even for a sensor having parameters such as offset, sensitivity, etc. varying non-linearly due to variation of the temperature, the temperature characteristics concerned can be surely corrected and a target physical quantity can be detected with high precision, and a sensor device using the detecting method.

In order to attain the above object, according to a first aspect, the relationship between an output of a sensor and an actual physical quantity to be determined by the sensor is approximated by a quadratic equation defined with the temperature characteristic of non-linearity of the sensor itself to the physical quantity and the temperature characteristic of parameters affecting the output of the sensor set as coefficients, each of the coefficients is approximated by a higher-order equation with the temperature set as an independent variable, the temperature coefficient thereof is stored in a storage unit in advance, and on the basis of the real-time output of the sensor, (a) the processing of substituting the temperature coefficient stored in the storage unit and the real-time temperature into the higher-order equation to determine the temperature characteristic of the non-linearity of the sensor itself to the physical quantity and the temperature characteristic of the parameters affecting the output of the sensor which are the coefficients of the quadratic equation, and (b) the processing of substituting the thus-achieved coefficients and the output of the sensor into the quadratic equation to calculate the actual physical quantity to be determined are executed to detect the actual physical quantity.

According to the physical quantity method as described above, the relationship between the output of the sensor and the actual physical quantity determined by the sensor is approximated by the quadratic equation, and the coefficients of the quadratic equation are approximated by the higher-order equation. Therefore, even in the case of a sensor, which varies non-linearly due to the variation of the temperature, the temperature characteristic thereof is surely compensated. Therefore, the actual physical quantity itself detected (calculated) through the execution of the processing of (a) and (b) corresponding to the processing of calculating the solutions of these equations is necessarily kept under high precision.

According to the physical quantity detecting method of a second aspect, if the sensitivity and offset of the sensor are used as the parameters affecting the output of the sensor, and each of the temperature characteristic of the non-linearity of the sensor itself to the physical quantity and the temperature characteristic of the sensitivity and the temperature characteristic of the offset which correspond to the coefficients of the quadratic equation is approximated with the higher-order equation used for the approximation using the temperature as an independent variable set to a quadratic equation, the time required until the actual physical quantity is detected can be suitably shortened through reduction of a load imposed on the execution of the processing of (a).

In the physical quantity detecting method, specifically, according to a third aspect, when the non-linearity of the sensor itself to the physical quantity is represented by A, the sensitivity of the sensor is represented by B, the offset of the sensor is represented by Co and the output of the sensor is represented by $C_1$, it is preferable to calculate the actual physical quantity X by executing the following calculation:

$$X=-\{(Co-C_1)/B\}\cdot[1+\{A\cdot(Co-C_1)/B^2\}]$$

According to this equation, the quadratic equation for defining the relationship between the output of the sensor and the actual physical quantity determined by the sensor is subjected to series expansion, and the quadratic equation is approximated with respect to the physical quantity X by using the terms thereof until the secondary term. If the actual physical quantity is calculated from the output of the sensor by using the calculation equation as described above, the calculation load could be further reduced, and thus the calculation time could be further shortened. Particularly when the output of the sensor is treated as digital data, the calculation of the quadratic equation is executed through a higher-order polynomial calculation, so that not only the scale of a circuit required to execute the calculation, but also the calculation time of the physical quantity is not negligible. In this sense, according to the physical quantity detecting method using the above calculation equation, the stereotype processing such as the processing (a) and the processing (b) is quickly executed, and not only the calculation time of the physical quantity can be shortened, but also the circuit scale can be suitably suppressed.

According to a fourth aspect, a sensor device comprises: a unit for inputting the output of a sensor for detecting a physical quantity; a storage unit, when the relationship between an output of the inputted sensor and an actual physical quantity to be determined by the sensor is approximated by a quadratic equation defined with the temperature characteristic of non-linearity of the sensor itself to the physical quantity and the temperature characteristic of parameters affecting the output of the sensor set as coefficients, and each of the coefficients is approximated by a higher-order equation with the temperature set as an independent variable, the storage unit storing the temperature coefficient thereof; and a calculating unit for substituting the temperature coefficient stored in the storage unit and the real-time temperature into the higher-order equation to determine the temperature characteristic of the non-linearity of the sensor itself to the physical quantity and the temperature characteristic of the parameters affecting the output of the sensor which are the coefficients of the quadratic equation, and substituting the thus-achieved coefficients and the output of the sensor into the quadratic equation to calculate the actual physical quantity to be determined are executed to detect the actual physical quantity.

According to the sensor device thus constructed, the physical quantity detecting method according to the first aspect can be faithfully executed through the calculation unit. Accordingly, even in the case of a sensor in which parameters such as offset, sensitivity, etc. vary non-linearly due to temperature variation, the temperature characteristic concerned can be surely compensated and the target physical quantity can be detected with higher precision by the sensor device as described above.

Furthermore, according to a fifth aspect, in the sensor device described above, if the parameters affecting the output of the sensor are the sensitivity and offset of the sensor, the calculation unit executes the calculation by approximating each of the temperature characteristic of the non-linearity of the sensor itself to the physical quantity and the temperature characteristic of the sensitivity and the temperature characteristic of the offset which correspond to the coefficients of the quadratic equation with the higher-order equation used for the approximation using the temperature as an independent variable set to a quadratic equation, the physical quantity detecting method according to the second aspect can be faithfully executed through the calculation unit. Accordingly, the calculation load can be reduced by even the sensor device as described above, and the time required to detect the actual physical quantity can be shortened.

In the sensor device as described above, specifically, according to a sixth aspect, when the non-linearity of the sensor itself to the physical quantity is represented by A, the sensitivity of the sensor is represented by B, the offset of the sensor is represented by Co and the output of the sensor is represented by $C_1$, it is preferable that the calculation unit calculates the actual physical quantity X by executing the following equation:

$$X=-\{(Co-C_1)/B\}\cdot[1+\{A\cdot(Co-C_1)/B^2\}]$$

AS described above, this calculation equation is an approximation equation for calculating the actual physical quantity detected by the sensor on the basis of the input sensor output, however, by calculating the actual physical quantity from the sensor output with this approximation equation, the calculation load on the calculation unit can be further reduced and the calculation time can be shortened under the state that required sufficient precision and the reliability can be secured.

Furthermore, according to a seventh aspect, the sensor device of the sixth aspect is designed so that the unit for inputting the output of the sensor is equipped with an AD converter for converting the output of the sensor thus input to a digital signal with a predetermined resolution, and the calculation unit comprises a digital signal processor for executing the calculation concerned on the basis of the thus-converted digital signal and the data indicating each temperature coefficient stored in the storage unit. Accordingly, the sensor device is particularly effective. That is, since the calculation of the quadratic equation in the digital signal processor is executed through a higher-order polynomial calculation, and thus the circuit scale of the digital signal processor and the calculation time cannot be neglected. In this sense, if the actual physical quantity is calculated by using the above-described calculation equation (approximating equation), the processing until the actual physical quantity is determined can be quickly executed by the digital signal processor, so that the calculation time of the physical quantity is shortened and the circuit scale of the digital signal processor can be suppressed.

According to an eighth aspect, the sensor device of the seventh aspect is designed so that the storage unit comprises an electrically writable ROM, and the data indicating each temperature coefficient are writable from the external. Accordingly, the temperature coefficient can be more flexibly set through the writing of the data indicating each temperature coefficient, and the temperature characteristic can be compensated with higher order of freedom, or more strictly.

According to a ninth aspect, the sensor device of the sixth aspect may be designed so that the relationship between the input sensor output and the actual physical quantity detected by the sensor is stored in ROM as temperature-basis map data achieved by collecting the calculation result of the calculation unit together with the temperature characteristic of the non-linearity of the sensor itself to the physical quantity and the temperature characteristic of parameters affecting the output of the sensor, and temperature information and the output information of the sensor for selecting the map data are supplied to ROM, thereby directly reading out the value of the actual physical quantity X from ROM. Even in the case of a sensor in which the parameters such as offset, sensitivity, etc. are non-linearly varied due to temperature variation, the temperature characteristics thereof can be surely compensated, and the target physical quantity can be detected with high precision.

DETAILED DESCRIPTION OF THE PREFERRED EMBODIMENTS

Preferred embodiments will be described hereunder with reference to the accompanying drawings.

An embodiment in which a physical quantity detecting method and a sensor device using the physical quantity detecting method are applied to a current sensor device for detecting the value of current flowing in a current path by using a magnetic detecting element such as a magneto-resistance element or the like magnetically, that is, on the basis of the magnitude of electric field intensity or magnetic vector which corresponds to the value of current will be described with reference to FIGS. 1 to 5.

Figure 1:
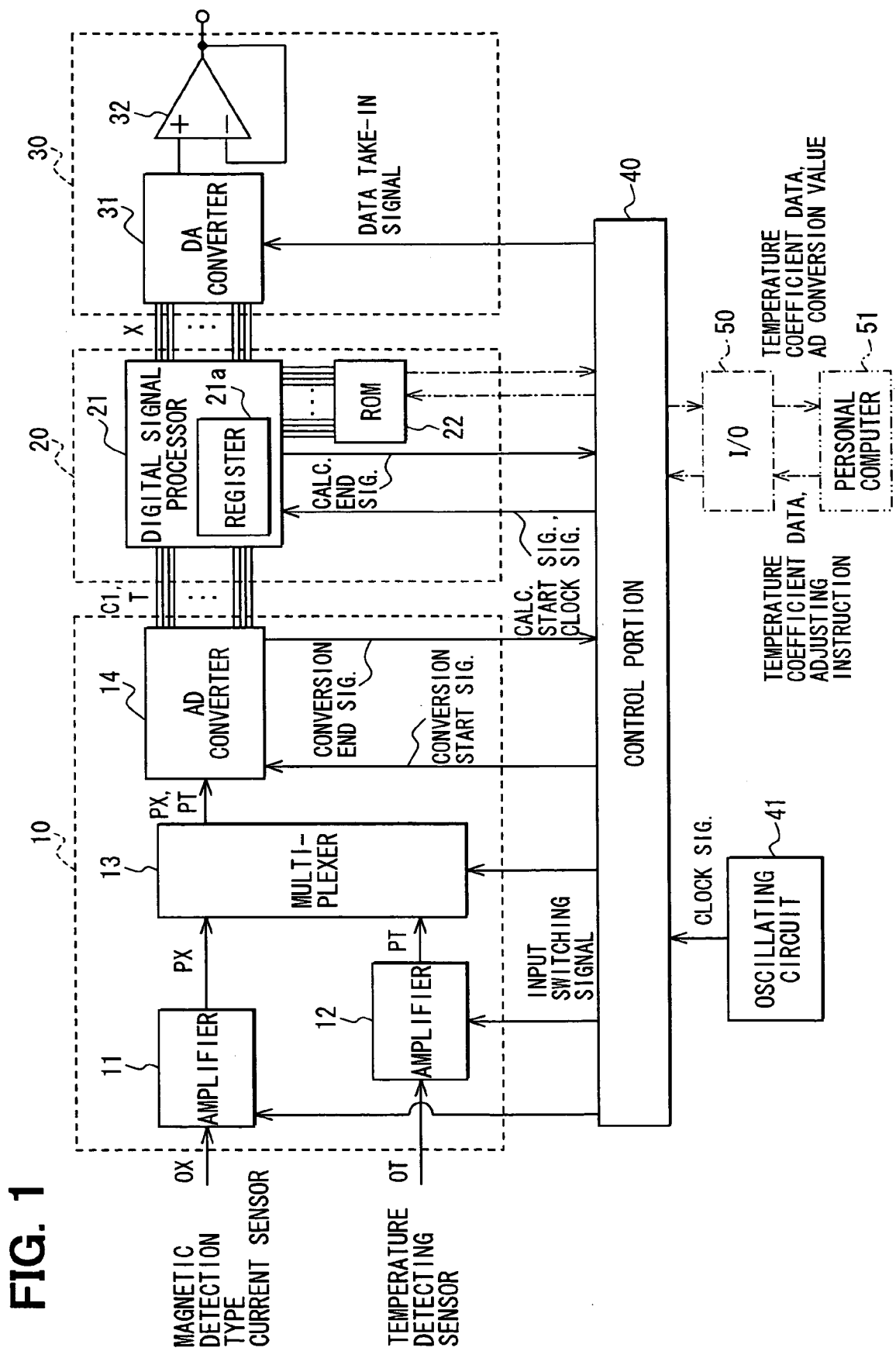
FIG. 1 is a block diagram showing a construction according to a first embodiment of a sensor device.

As shown in FIG. 1, the sensor device basically comprises an input portion 10 connected to a sensor, a calculating portion (calculating unit) 20, an output portion 30, and a control portion 40 for controlling the operation of each portion. In this embodiment, the sensor connected to the input portion 10 comprises two sensors of a magnetic detection type current sensor and a temperature detecting sensor as described above.

The current sensor comprises a sensor chip having a magneto-resistance element formed so as to have a half bridge circuit, for example, and a bias magnet for applying a magnetic vector to the magneto-resistance element which are formed on a substrate. The substrate is mounted on a current path such as a bus bar as a current detecting target of the current sensor under the state that the substrate is molded by mold material of resin or the like. In this construction, the composite vector of a magnetic vector generated by current flowing in the bus bar and the magnetic vector of the bias magnet is angularly varied in connection with the variation of the current. The current sensor sensitizes the angular variation of the composite vector as described above to detect the current amount of the current flowing in the bus bar, and outputs the original sensor signal OX corresponding to the current amount thus detected.

Furthermore, the temperature detecting sensor is constructed as a full bridge circuit in which a temperature sensitive resistant element formed of a diffusion resistor (temperature coefficient ranges from about 1500 to about 1700 pm/° C.) and a diffusion resistor (reference resistance element) formed of CrSi which is formed of material whose temperature coefficient is near to zero, for example, are alternately connected to each other as in the case of the sensor disclosed in the Patent Document 1. The temperature detecting sensor applies a bridge voltage to the bridge circuit and outputs a temperature detection signal OT on the basis of the variation of the resistance value of the temperature sensitizing resistance element when the temperature is varied under the voltage-applied state, that is, the variation of the potential difference between the confronting connection points of the temperature sensitizing resistance element and the reference resistance element. Here, the original sensor signal OX and the temperature detection signal OT may be differential signals.

For example, in the case of the sensor device connected to the sensor as described above, the input portion 10 serves to convert each of the original sensor signal OX input from the current sensor and the temperature detecting signal OT input from the temperature detecting sensor to the corresponding digital signal with predetermined resolution. That is, specifically, the input portion 10 comprises an amplifier 11 connected to the current sensor, an amplifier 12 connected to the temperature detecting sensor, a multiplexer 13, and an AD converter 14 for executing the conversion to the digital signals as shown in FIG. 1. Here, the multiplexer 13 is a circuit for selecting any one signal of a sensor amplified signal PX from the amplifier 11 on the basis of an input switching signal from the control portion 40 and a temperature amplified signal PT from the amplifier 12, and outputting the selected signal to the AD converter 14. Accordingly, the AD converter 14 converts the signal input from the multiplexer 13 to the digital signal having the predetermined resolution with a conversion start signal from the control portion 40 as a trigger. When the conversion from the signal to the corresponding digital signal is completed, the AD converter 14 outputs a conversion end signal indicating the completion of the conversion to the control portion 40. Then, the AD converter 14 outputs the digital signal corresponding to the sensor amplified signal PX and the digital signal corresponding to the temperature amplified signal PT as an AD conversion value $C_1$ and temperature data T to the calculating portion 20.

Furthermore, in the sensor device, the calculating portion 20 comprises a digital signal processor 21 and ROM (storage unit) 22. Plural temperature coefficients (described later) used to execute the calculation processing described later by the digital signal processor 21 are stored in advance. The digital signal processor 21 is equipped with plural registers 21a and stores the sensor signal AD conversion value Cr or the temperature data T input from the AD converter 14 into the registers 21a. When the calculation start signal is input from the controller 40, the digital signal processor 21 executes predetermined logical operation to calculate the actual physical quantity (estimated value X) to be determined by the current sensor, that is, the digital value indicating the current amount flowing in the bus bar on the basis of the AD conversion value $C_1$, the temperature data T and the temperature coefficient. When the logical operation is finished, the digital signal processor 21 outputs an operation end signal to the control portion 40. The digital signal processor 21 executes the above operation processing in synchronism with a clock signal supplied from the control portion 40.

Here, the logic operation (calculation processing) executed by the digital signal processor 21 will be described in more detail. The logical operation is executed as standard processing for calculating the estimated value X by substituting the AD conversion value $C_1$, the temperature data T and the temperature coefficient into the following logical expression. First, an example of deriving the operational expression used in the operational processing as described above will be described with reference to FIG. 2.

<Derivation of Operational Expression>

In this embodiment, as the temperature characteristic of the sensor are considered the temperature characteristic of the non-linearity of the sensor itself to the intensity of magnetic field and the temperature characteristic of parameters affecting the output of the sensor, that is, offset and sensitivity. Accordingly, when the relationship between the AD conversion value $C_1$ and the estimated value X is defined by the following quadratic equation when the non-linearity of the sensor itself to the intensity of magnetic field (the magnitude of the magnetic vector) is represented by A, the sensitivity of the sensor is represented by B and the offset of the sensor is represented by Co, $$\text{AD conversion value } C_1 = A \bullet X^2 + B \bullet X + Co$$

With respect to the non-linearity A, the sensitivity B and the offset Co, they are approximated by quadratic equations each of which uses the temperature data T as an independent variable. That is, when the temperature coefficients of the non-linearity A are set to $N_0$ to $N_2$, the temperature coefficients of the sensitivity B are set to $S_0$ to $S_2$, and the temperature coefficients of the offset Co are set to $O_0$ to $O_2$, the non-linearity A, the sensitivity B and the offset Co are defined as follows:

$$\text{Non-linearity } A = N_2 \bullet T^2 + N_1 \bullet T + N_0$$

$$\text{Sensitivity } B = S_2 \bullet T^2 + S_1 \bullet T + S_0$$

$$\text{Offset } Co = O_2 \bullet T^2 + O_1 \bullet T + O_0$$

Figures 2, 3:
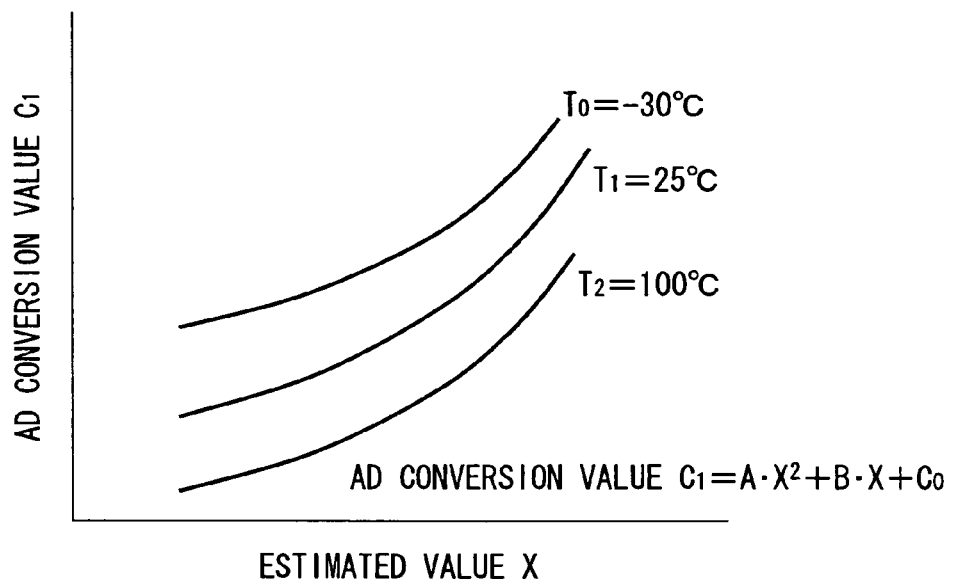
FIG. 2 is a graph showing an example of the relationship between an AD conversion value (sensor output) and an estimated value (actual physical quantity)
FIG. 3 is a diagram showing a list of the relationship between the temperature coefficient used when a physical quantity is detected and each parameter of offset, sensitivity and non-linearity on the assumption of the relationship shown in FIG. 2.

FIG. 2 is a graph showing the relationship between the AD conversion value $C_1$ and the estimated value X when the temperature characteristic is approximated as described above. FIG. 3 is a table showing the quadratic equations defining the non-linearity A, the sensitivity B and the offset Co and the respective temperature coefficients of the quadratic equation. The values of the temperature coefficients $O_0$ to $O_2$, $S_0$ to $S_2$ and $N_0$ to $N_2$ are stored in advance in ROM 22 equipped to the calculating portion 20.

Here, when the quadratic equation indicating the relationship between the AD conversion value $C_1$ and the estimated value X is solved with respect to the estimated value X, $$\text{Estimated value } X = \{-B \pm (B^2 - 4 \bullet A \bullet C)^{1/2}\}/(2 \bullet A)$$

If this equation is solved in a case where the sensitivity B is positive, the estimated value X could be calculated by the digital signal processor 21. However, the calculation in the digital signal processor 21 on the basis of this equation is a calculation for a higher-order polynomial expression achieved as a result of the series expansion of the equation concerned, and thus the calculation load imposed until the estimated value X is calculated and the calculation time cannot be neglected. Therefore, according to this embodiment, the load imposed on the calculation of the estimated value X by the digital signal processor 21 can be reduced and the calculation time can be shortened according to the following procedure.

That is, when $(1+X)^{1/2}$ is subjected to series expansion, the following higher-order polynomial expression can be achieved:

$$(1+X)^{1/2} = 1 + (1/2) \bullet X - (1/8) \bullet X^2 + .$$

The quadratic equation indicating the relationship between the AD conversion value $C_1$ and the estimated value X is set in order by using the terms of the polynomial expression till the quadratic term. Then, by setting $C = Co - C_1$, the following operational expression (approximation equation) is derived:

$$\text{Estimated value } X = -(C/B) \bullet \{1 + A \bullet (C/B)^2\}$$

In the digital signal processor 21 of this embodiment, the estimated value X is calculated by using this approximation equation. That is, the digital signal processor 21 substitutes the real-time temperature data T into the quadratic equation defining each of the non-linearity A, the sensitivity B and the offset $Co_1$ and also substitutes each parameter of the thus-calculated non-linearity A, sensitivity B and offset Co into the approximation equation to calculate the estimated value X.

Figure 4:
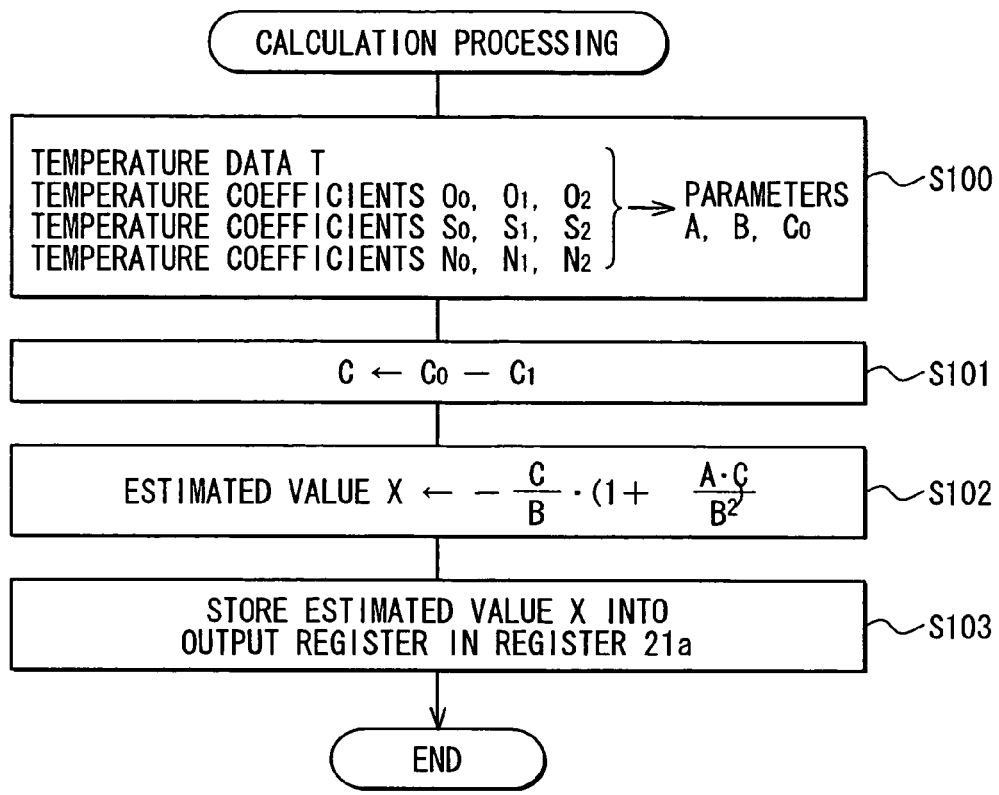
FIG. 4 is a flowchart showing the processing flow of the calculation processing executed by a digital signal processor constituting a calculating portion of the sensor device according to the embodiment.

FIG. 4 is a flowchart showing the calculation processing executed by the digital signal processor 21, and the processing procedure of the calculation processing will be described with reference to the flowchart.

<Procedure of Calculation Processing>

1. Each of the non-linearity A, the sensitivity B and the Offset Co is calculated from the real-time temperature data T stored in the register 21*a* and the temperature coefficients $O_0$ to $O_2$, $S_0$ to $S_2$ and $N_0$ to $N_2$ stored in ROM 22 (step S100 of FIG. 4).
2. The variable C (=Co−$C_1$) is calculated by using the offset Co and the AD conversion value $C_1$ (step S101 of FIG. 4).
3. The non-linearity A, the sensitivity B and the variable C are substituted into the above-described approximation equation to calculate the estimated value X (step S102 of FIG. 4).
4. The estimated value X is stored into an output register in the register 21*a* (step S103 of FIG. 4).

The calculation processing containing the digital conversion in the AD converter 14 can be executed by a microcomputer or the like. In this case, the calculation processing as described above may be the processing in an electronic control device used for engine control or the like, for example. However, as described above, the content of the calculation processing concerned is the standard processing, and thus by setting this processing as a so-called DSP (Digital Signal Processor)-based operation of the digital signal processor 21 like this embodiment, the calculation of the estimated value X can be executed at high speed, and the real-time performance can be suitably secured.

Furthermore, in the sensor device shown in FIG. 1, the output portion 30 comprises a DA converter 31 and a voltage follower 32. When a data reception signal is input from the control portion 40 to the output portion 30, the output portion 30 receives an estimated value X stored in the output register of the register 21*a* of the digital signal processor 21, converts the estimated value X to the analog signal in the DA converter 31, and then outputs the thus-converted analog signal to the voltage follower 32. As described above, by converting the estimated value X corresponding to the digital value to the analog signal, even when the sensor device and the electric control device are spaced from each other at some distance, they can be basically connected to each other through one signal line.

The conversion of the estimated value X to the analog signal is arbitrary, and for example when the sensor device is installed in the electric control device and there is no problem in the number of wires (the number of signal lines) therebetween, the output portion 30 may be omitted, and the estimated value X comprising the digital value may be output to the control portion (microcomputer) in the direct electric control device. Furthermore, any construction may be adopted for the output portion 30, and it may be constructed to have a parallel serial conversion circuit, and the transmission of the estimated value X to the electric control device may be carried through serial communication.

Figure 5:
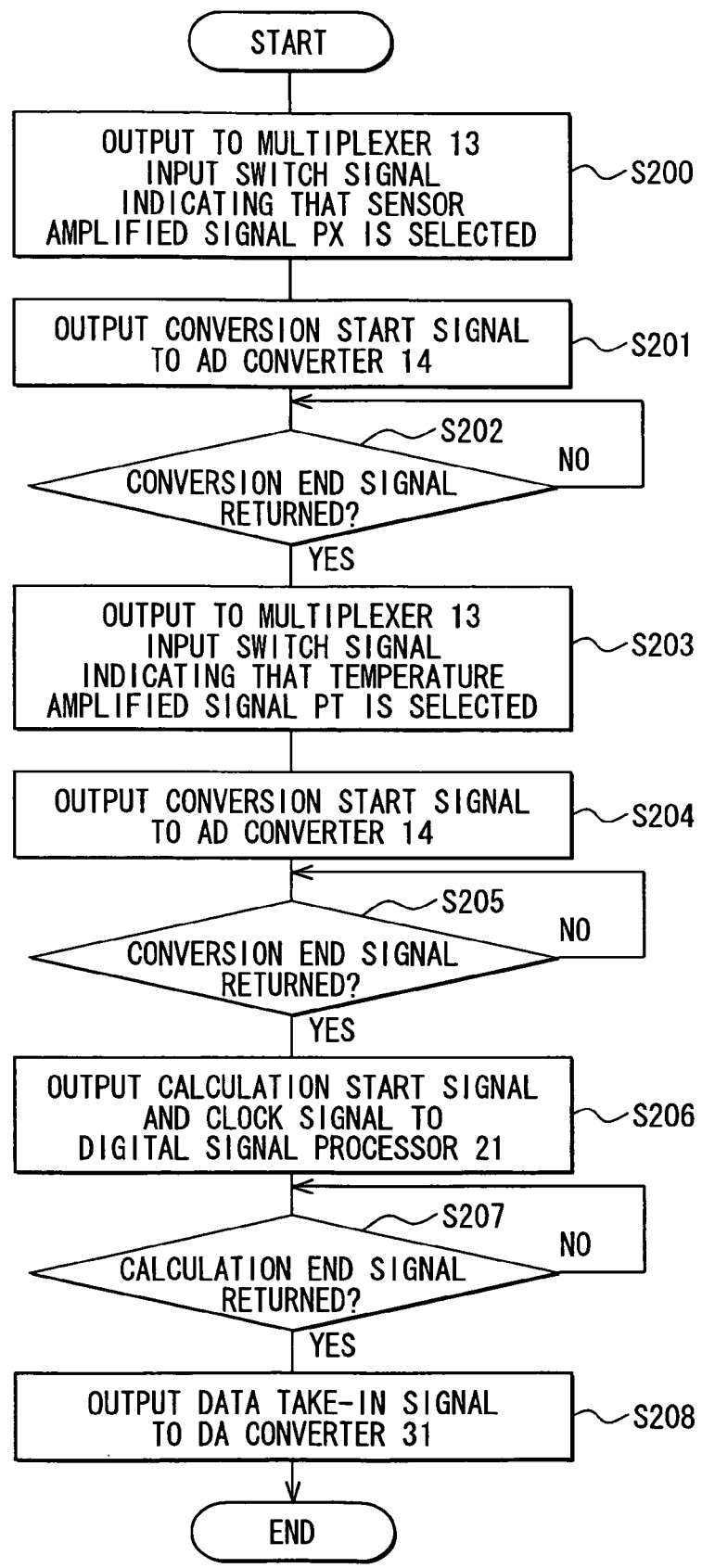
FIG. 5 is a flowchart showing the processing flow of the processing executed by a control portion of the sensor device according to the embodiment.

In the sensor device shown in FIG. 1, the control portion 40 is constructed by a well-known logic circuit, and collectively controls the multiplexer 13 and the AD converter 14 of the input portion 10, the digital signal processor 21 of the calculating portion 20 and the DA converter 31 of the output portion 30 in synchronism with a clock signal input from an oscillating circuit 41. FIG. 5 is a flowchart showing the processing executed by the control portion 40, and the procedure of this processing will be described with reference to the flowchart.

1. An input switching signal indicating that the sensor amplified signal PX is selected is output to the multiplexer 13 (step S200 of FIG. 5).
2. The conversion start signal is output to the AD converter 14 (step S201 of FIG. 5), whereby the conversion of the sensor amplified signal PX to the digital signal is started.
3. Return of the conversion end signal from the AD converter 14 is awaited (step S202 of FIG. 5).
4. After the conversion end signal is returned from the AD converter 14, that is, after the AD conversion value $C_1$ is calculated, an input switching signal indicating that the temperature amplified signal PT is selected is output to the multiplexer 13 (step S203 of FIG. 5).
5. The conversion start signal is output to the AD converter 14 (step S204 of FIG. 5), whereby the conversion of the temperature amplified signal PT to the digital signal is started.
6. Return of the conversion end signal from the AD converter 14 is awaited (step S205 of FIG. 5).
7. After the conversion end signal is returned from the AD converter 14, that is, after the temperature data T is achieved, the calculation start signal and the clock signal are output to the digital signal processor 21 (step S206 of FIG. 5). Accordingly, the above-described calculation processing is executed in the digital signal processor 21.
8. Return of the calculation end signal from the digital signal processor 21 is awaited (step S207 of FIG. 5).
9. After the calculation end signal is returned from the digital signal processor 21, that is, after the estimated value X is calculated, the data reception signal is output to the DA converter 31 (step S208 of FIG. 5), whereby the calculated estimated value X is converted to the analog signal.

Furthermore, the control portion 40 is also equipped with a circuit for carrying out gain setting, zero-point adjustment, etc. of the amplifiers 11, 12 of the input portion 10. The gain setting, zero-point adjustment, etc. of the amplifiers 11, 12 are carried out through this circuit in the manufacturing process, for example.

According to the physical quantity detecting method and the sensor device using the detecting method according to this embodiment, the following effects can be achieved.

(1) The relationship between the output of the sensor (AD conversion value $C_1$) and the actual physical quantity (estimated value X) determined by the sensor is approximated by a quadratic equation, and the coefficients of this quadratic equation, that is, the non-linearity A, the sensitivity B and the offset Co are also approximated by a quadratic equation using the temperature data T as an independent variable. Therefore, the temperature characteristic of the sensor is surely compensated. Furthermore, the non-linearity A, the sensitivity B and the offset Co are calculated on the basis of the real-time temperature data T, and thus the estimated value X can be calculated with higher precision.

(2) The temperature characteristic of each parameter of the non-linearity A, the sensitivity B and the offset Co is approximated by the quadratic equation using the temperature data T as an independent variable. The temperature characteristic which is originally defined by a higher-order equation is approximated by the quadratic equation, whereby the load needed to execute the calculation processing in the digital signal processor 21 can be reduced and the calculation time can be shortened. Even when the temperature characteristic is approximated by the quadratic equation, the estimated value X can be calculated with practically sufficient precision.

(3) In the digital signal processor 21, the quadratic equation defining the relationship between the AD conversion value $C_1$ and the estimated value X is subjected to series expansion to achieve a polynomial expression, and the approximation equation for the estimated value X which uses the terms of the polynomial expression till the quadratic term is used to carry out the calculation. Therefore, the calculation time can be greatly shortened, and the calculation load can be also reduced. Furthermore, by calculating the estimated value X with the approximation equation, the circuit scale of the digital signal processor 21 can be suppressed.

(4) The processing until the estimated value X is calculated from the AD conversion value $C_1$ corresponding to the output of the sensor, the temperature coefficients $O_0$ to $O_2$, $S_0$ to $S_2$ and $N_0$ to $N_2$ and the real-time temperature data T is executed by the DSP (Digital Signal Processor)-based processing of the digital signal processor 21, and thus the estimated value X can be calculated at high speed.

(5) The data to be stored in ROM 22 are limited to only the nine temperature coefficients $O_0$ to $O_2$, $S_0$ to $S_2$ and $N_0$ to $N_2$, and thus a ROM having a small storage capacity can be used as ROM 22, which also contributes to promotion of miniaturization of the sensor device.

The physical quantity detecting method and the sensor device is not limited to the above-described embodiment, and various modifications as described below may be made to the above-described embodiment.

(1) In the above-described embodiment, in order to reduce the calculation load in the digital signal processor 21, the quadratic equation indicating the relationship between the AD conversion value $C_1$ and the estimated value X is subjected to series expansion, and the approximation equation is derived by using only the terms of the polynomial expression up to the quadratic term which are achieved by the series expansion, and the estimated value X is calculated by using this approximation equation. However, the number of the terms of the polynomial expression used to derive the approximation equation concerned is set to any number, and when the digital signal processor 21 has margin processing capability, the approximation equation may be derived by using the terms of the polynomial expression up to the quartic term.

In this case, the temperature characteristic of the sensor can be compensated with higher precision.

(2) In the above-described embodiment, the data of the temperature coefficients $O_0$ to $O_2$, $S_0$ to $S_2$ and $N_0$ to $N_2$ supplied for the calculation processing of the digital signal processor 21 are stored in ROM 22 in advance. Alternatively, the temperature coefficients $O_0$ to $O_2$, $S_0$ to $S_2$ and $N_0$ to $N_2$ may be determined for every sensor, and the data of the temperature coefficients $O_0$ to $O_2$, $S_0$ to $S_2$ and $N_0$ to $N_2$ thus determined are separately stored in ROM 22. Specifically, ROM 22 is replaced by an electrically writable flash memory, EEPROM or the like. Furthermore, as indicated by one-dotted chain line in FIG. 1, an input circuit (I/O) 50 is provided between a personal computer 51 and the control portion 40, and the content of ROM 22 is suitably changed through the input/output circuit 50.

In the construction as described above, the procedure of registering the optimal temperature coefficients $O_0$ to $O_2$, $S_0$ to $S_2$ and $N_0$ to $N_2$ every sensor will be described with reference to the block diagram of FIG. 1.

1. First, in the control portion 40, the AD conversion value $C_1$ stored in the register 21a of the digital signal processor 21 is received, and output to the personal computer (computing device) 51 through the input/output circuit 50.
2. The personal computer 51 calculates the optimal temperature coefficients $O_0$ to $O_2$, $S_0$ to $S_2$ and $N_0$ to $N_2$ on the basis of the AD conversion value $C_1$, and outputs an adjustment instruction for writing the thus-calculated temperature coefficients $O_0$ to $O_2$, $S_0$ to $S_2$ and $N_0$ to $N_2$ into ROM 22 through the input/output circuit 50 to the control portion 40.
3. On the basis of the input of the temperature coefficients $O_0$ to $O_2$, $S_0$ to $S_2$ and $N_0$ to $N_2$ and the adjustment instruction from the personal computer 51, the control portion 40 writes the values (data) of the temperature coefficients $O_0$ to $O_2$, $S_0$ to $S_2$ and $N_0$ to $N_2$ into ROM 22.
4. Furthermore, in order to check that the output temperature coefficients $O_0$ to $O_2$, $S_0$ to $S_2$ and $N_0$ to $N_2$ have been written into ROM 22, the personal computer 51 outputs to the control portion 40 through the input/output circuit 50 an instruction indicating that the read-in of the storage content of ROM 22 is desired.
5. When the instruction indicating that the read-in of the content of ROM 22 is desired is input to the control portion 40, the control portion 40 reads out the temperature coefficients $O_0$ to $O_2$, $S_0$ to $S_2$ and $N_0$ to $N_2$ stored in ROM 22, and outputs the values (data) of the read-out temperature coefficients $O_0$ to $O_2$, $S_0$ to $S_2$ and $N_0$ to $N_2$ through the input/output circuit 50 to the personal computer 51.
6. Comparing the values of the output temperature coefficients $O_0$ to $O_2$, $S_0$ to $S_2$ and $N_0$ to $N_2$ with the input temperature coefficients $O_0$ to $O_2$, $S_0$ to $S_2$ and $N_0$ to $N_2$, the personal computer 51 judges whether the writing into ROM 22 have been surely carried out.

As described above, by registering the optimal temperature coefficients $O_0$ to $O_2$, $S_0$ to $S_2$ and $N_0$ to $N_2$ into ROM 22 for every sensor, even when the temperature coefficients $O_0$ to $O_2$, $S_0$ to $S_2$ and $N_0$ to $N_2$ are different for every sensor, the temperature characteristic of the sensor to be connected can be surely compensated. In this case, an example of registering the optimal temperature coefficients $O_0$ to $O_2$, $S_0$ to $S_2$ and $N_0$ to $N_2$ for every sensor has been described. However, various types may be adopted as the values of the temperature coefficients $O_0$ to $O_2$, $S_0$ to $S_2$ and $N_0$ to $N_2$ to be registered in ROM 22. For example, a plurality of optimal temperature coefficients $O_0$ to $O_2$, $S_0$ to $S_2$ and $N_0$ to $N_2$ are determined in advance for every sensor, and the average value thereof is registered in ROM 22.

Figure 6:
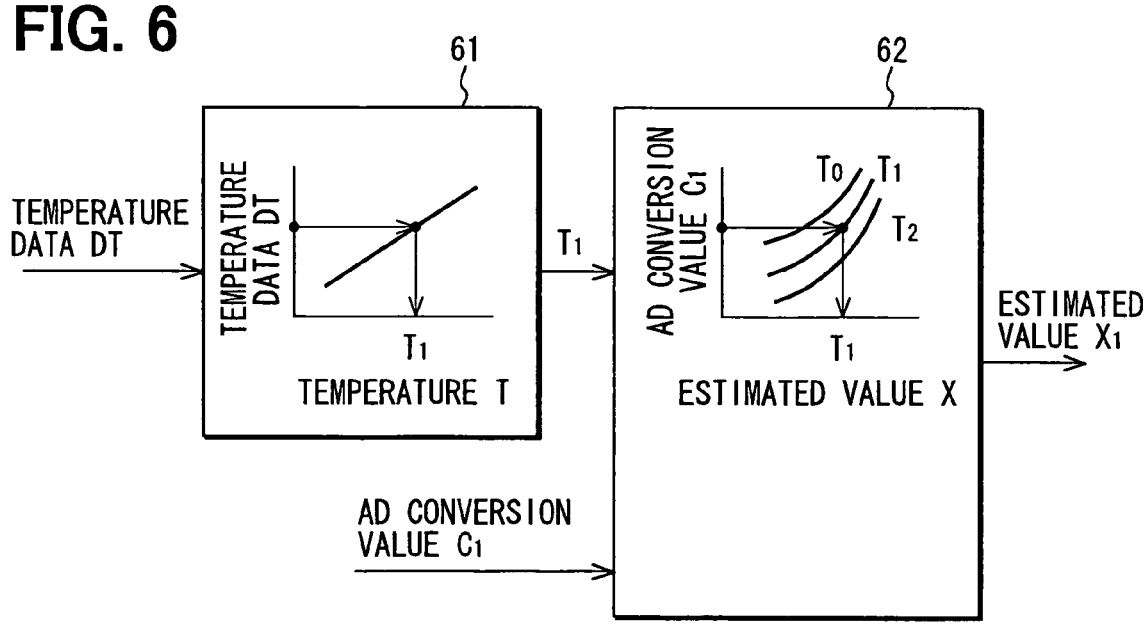
FIG. 6 is a block diagram showing a modification of the calculating portion of the sensor device according to the embodiment.

Any construction may be adopted for the calculating portion 20. For example, as shown in FIG. 6, the calculating portion 20 may be constructed by ROM 61 and ROM 62 in place of the digital signal processor 21. The temperature data DT corresponding to the digital signal of the temperature amplified signal PT, and the temperature T corresponding to the temperature data DT are stored as map data in advance. When the temperature data DT are input to ROM 61, ROM 61 determines the temperature data T corresponding to the temperature data DT, for example, the temperature data T1 from the map data, and outputs the temperature data T1 to ROM 62. Furthermore, the relationship between the AD conversion value $C_1$ and the estimated value X, containing the temperature characteristic of the non-linearity of the sensor itself to the physical quantity and the temperature characteristics of the parameters affecting the output of the sensor, that is, the sensitivity B and the offset Co, is stored as temperature-based map data containing the same integrated results as the calculation of the digital signal processor 21. The estimated value X is directly read out from ROM 62 on the basis of the supply of the temperature information for selecting the map data and the output information of the sensor from ROM 61. That is, in this case, when the temperature data T1 is input from ROM 61 and the AD conversion value $C_1$ is input from the input portion 10, the curved line corresponding to the temperature data T1 is selected from the map data, and the estimated value X corresponding to the AD conversion value $C_1$ is determined on the selected curved line. When each map data stored in ROM 61 and ROM 62 is read out, a suitable interpolation calculation may be adopted. With respect to even the sensor device thus constructed, by supplying the real-time temperature information and the output information of the sensor to ROM 62, the temperature characteristic can be surely compensated for even a sensor in which the parameters such as the offset Co, the sensitivity B, etc. are non-linearly varied due to the temperature variation, and the target physical quantity can be detected with higher precision.

The sensor connected to the sensor device according to the present invention is not limited to the current sensor (magnetic detection type current sensor) described above. The sensor device according to the present invention is applicable to a sensor in which the parameters such as the sensitivity B, the offset Co, etc. are non-linearly varied due to the temperature variation.

What is claimed is:
1. A physical quantity detecting method for detecting an actual physical quantity, the method comprising:
   approximating a relationship between an output of a sensor and the actual physical quantity to be determined by the sensor by setting as coefficients of a quadratic equation a non-linearity of the sensor itself to the physical quantity and parameters affecting the output of the sensor, wherein the quadratic equation is expressed as:

$$C_1 = A \cdot X^2 + B \cdot X + C_0$$

wherein $C_1$ represents an AD-converting value, X represents the actual physical quantity, A represents non-linearity to the physical quantity, and B and $C_0$ are the parameters affecting the output of the sensor;
   approximating each of the coefficients by a higher-order equation with the temperature set as an independent variable;

storing the temperature coefficient thereof in a storage unit in advance; and on the basis of real-time output of the sensor, executing processing of:

substituting the temperature coefficient stored in the storage unit and the real-time temperature into the higher-order equation to determine the non-linearity of the sensor itself to the physical quantity and the parameters affecting the output of the sensor which are the coefficients of the quadratic equation;

substituting the thus-achieved coefficients and the output of the sensor into the quadratic equation to calculate the actual physical quantity to be determined to detect the actual physical quantity; and storing the actual physical quantity in the storage unit.

2. The physical quantity detecting method according to claim 1, wherein the sensitivity and the offset of the sensor are used as the parameters affecting the output of the sensor, and each of the non-linearity of the sensor itself to the physical quantity and the sensitivity and the offset which correspond to the coefficients of the quadratic equation is approximated with the higher-order equation used for the approximation using the temperature as an independent variable set to a quadratic equation.

3. The physical quantity detecting method according to claim 2, wherein when the non-linearity of the sensor itself to the physical quantity is represented by A, the sensitivity of the sensor is represented by B, the offset of the sensor is represented by Co and the output of the sensor is represented by C1, the actual physical quantity X is calculated by executing the following calculation:

$$X=-\{(Co-C1)/B\}\times[1+\{A\times(Co-C1)/B^2\}].$$

4. A sensor device for detecting an actual physical quantity comprising:

a unit for inputting the output of a sensor for detecting a physical quantity;

a storage unit, when the relationship between an output of a sensor and an actual physical quantity to be determined by the sensor is approximated by a quadratic equation defined with the non-linearity of the sensor itself to the physical quantity and the parameters affecting the output of the sensor set as coefficients, wherein the quadratic equation is expressed as:

$$C_1 = A \cdot X^2 + B \cdot X + C_0$$

wherein $C_1$ represents an AD-converting value, X represents the actual physical quantity, A represents non-linearity to the physical quantity, and B and $C_0$ are the parameters affecting the output of the sensor, and wherein each of the coefficients is approximated by a higher-order equation with the temperature set as an independent variable, the storage unit being for storing the temperature coefficients thereof; and a calculating unit for substituting the temperature coefficient stored in the storage unit and the real-time temperature into the higher-order equation to determine the non-linearity of the sensor itself to the physical quantity and the parameters affecting the output of the sensor which are the coefficients of the quadratic equation, and substituting the thus-achieved coefficients and the output of the sensor into the quadratic equation to calculate the actual physical quantity to be determined to detect the actual physical quantity;

wherein the actual physical quantity is stored in the storage unit.

5. The sensor device according to claim 4, wherein the parameters affecting the output of the sensor are the sensitivity and offset of the sensor, the calculation unit executes the calculation by approximating each of the non-linearity of the sensor itself to the physical quantity and the sensitivity and the offset which correspond to the coefficients of the quadratic equation with the higher-order equation used for the approximation using the temperature as an independent variable set to a quadratic equation.

6. The sensor device according to claim 5, wherein when the non-linearity of the sensor itself to the physical quantity is represented by A, the sensitivity of the sensor is represented by B, the offset of the sensor is represented by Co and the output of the sensor is represented by C1, the calculation unit calculates the actual physical quantity X by executing the following equation:

$$X=-\{(Co-C1)/B\}\times[1+\{A\times(Co-C1)/B^2\}].$$

7. The sensor device according to claim 6, wherein the unit for inputting the output of the sensor is equipped with an AD converter for converting the output of the sensor thus input to a digital signal with a predetermined resolution, and the calculation unit comprises a digital signal processor for executing the calculation concerned on the basis of the thus-converted digital signal and the data indicating each temperature coefficient stored in the storage unit.

8. The sensor device according to claim 7, wherein the storage unit comprises an electrically writable ROM, and the data indicating each temperature coefficient are externally writable.

9. The sensor device according to claim 6, wherein the relationship between the input sensor output and the actual physical quantity detected by the sensor is stored in ROM as temperature-basis map data achieved by collecting the calculation result of the calculation unit together with the non-linearity of the sensor itself to the physical quantity and the parameters affecting the output of the sensor, and temperature information and the output information of the sensor for selecting the map data are supplied to ROM, thereby directly reading out the value of the actual physical quantity from ROM.

* * * * *